United States Patent
Barry et al.

(10) Patent No.: US 10,545,200 B2
(45) Date of Patent: Jan. 28, 2020

(54) SIMULTANEOUS VECTOR MAGNETOMETRY WITH NITROGEN VACANCY CENTERS IN DIAMOND OR OTHER SOLID-STATE SPIN SENSORS

(71) Applicant: President and Fellows of Harvard College, Cambridge, MA (US)

(72) Inventors: John Francis Barry, Cambridge, MA (US); Jennifer May Schloss, Cambridge, MA (US); Matthew James Turner, Somerville, MA (US); Mikael Paul Backlund, Cambridge, MA (US); Ronald Walsworth, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 16/307,850

(22) PCT Filed: May 31, 2017

(86) PCT No.: PCT/US2017/035194
§ 371 (c)(1),
(2) Date: Dec. 6, 2018

(87) PCT Pub. No.: WO2017/213928
PCT Pub. Date: Dec. 14, 2017

(65) Prior Publication Data
US 2019/0178959 A1    Jun. 13, 2019

Related U.S. Application Data

(60) Provisional application No. 62/346,193, filed on Jun. 6, 2016.

(51) Int. Cl.
*G01V 3/00* (2006.01)
*G01R 33/26* (2006.01)
(Continued)

(52) U.S. Cl.
CPC .......... *G01R 33/26* (2013.01); *G01R 33/0041* (2013.01); *G01R 33/032* (2013.01); *G01R 33/1215* (2013.01)

(58) Field of Classification Search
CPC ........ G01R 33/24; G01R 33/26; G01R 33/32; G01R 33/323; G01R 33/60;
(Continued)

(56) References Cited

U.S. PATENT DOCUMENTS 8,547,090 B2    10/2013    Lukin et al.
9,784,804 B2 *  10/2017    Walsworth ........... G01R 33/323
(Continued)

OTHER PUBLICATIONS

International Search Report and Written Opinion dated Aug. 24, 2017, in the International Application No. PCT/US17/35194, 14 pages.

(Continued)

*Primary Examiner* — Thang X Le
(74) *Attorney, Agent, or Firm* — Wilmer Cutler Pickering Hale and Dorr LLP

(57) ABSTRACT

A system and method for performing vector magnetometry are described. A method can include illuminating diamond with a modulated optical signal and a modulated microwave (MW) signal. A first, bias magnetic field is also applied to the diamond. Light emitted from the diamond in response to the optical signal, the MW signal, and the first magnetic field is detected via a single detector at a fixed position relative to the diamond. A modulation of the detected light encodes information corresponding to a plurality of nitrogen vacancy (NV) axes of the diamond.

18 Claims, 6 Drawing Sheets

(51) Int. Cl.
*G01R 33/032* (2006.01)
*G01R 33/00* (2006.01)
*G01R 33/12* (2006.01)

(58) Field of Classification Search
CPC .... G01R 33/1284; G01N 24/08; G01N 24/10; G01N 24/12; G01N 21/87; G01N 24/645; G01N 24/6458; G01N 24/6486; G01N 24/6489
See application file for complete search history.

(56) References Cited

U.S. PATENT DOCUMENTS

| | | | |
|---|---|---|---|
| 10,126,377 B2* | 11/2018 | Hahn | G01N 21/64 |
| 2014/0061510 A1 | 3/2014 | Twitchen et al. | |
| 2014/0072008 A1* | 3/2014 | Faraon | H01S 3/1681 372/45.01 |
| 2014/0166904 A1* | 6/2014 | Walsworth | G01N 21/6489 250/459.1 |
| 2015/0001422 A1* | 1/2015 | Englund | G01N 21/6458 250/459.1 |
| 2015/0192532 A1 | 7/2015 | Clevenson et al. | |
| 2016/0054402 A1* | 2/2016 | Meriles | G01R 33/282 324/309 |
| 2016/0161583 A1* | 6/2016 | Meriles | G01R 33/5605 324/309 |
| 2017/0343695 A1* | 11/2017 | Stetson | G01V 3/101 |
| 2018/0203080 A1* | 7/2018 | Acosta | G01R 33/302 |

OTHER PUBLICATIONS

"Code-division multiple access," definition; Wikipedia; reviewed on Apr. 29, 2016, 10 pages. (https://en.wikipedia.org/wiki/Code-division_multiple_access).

Bar-Gill et al., "Solid-state electronic spin coherence time approaching one second," Nature Communications, published Apr. 23, 2013, vol. 4, Article No. 1743, 6 pages.

Barry et al., "Optical magnetic detection of single-neuron action potentials using quantum defects in diamond," PNAS, Dec. 6, 2016, vol. 113, No. 49, pp. 14133-14138.

Beauchamp, Applications of Walsh and Related Functions: With an Introduction to Sequence Theory, (from the series on Microelectronics and Signal Processing), Academic Press, Feb. 11, 1984, entire book: pp. ix-308.

Devience et al., Nanoscale NMR spectroscopy and imaging of multiple nuclear species, Nature Nanotechnology, Jan. 5, 2015, vol. 10, pp. 129-134.

Gold, "Optimal binary sequences for spread spectrum multi-plexing (Corresp.)," IEEE Transactions on Information Theory, Oct. 4, 1967, vol. 13, Issue 4, pp. 619-621.

Lathi, Modern Digital and Analog Communication Systems, Third Edition, Oxford University Press, USA, Apr. 10, 1998, 554 pages.

Le Sage et al., "Optical magnetic imaging of living cells," Nature, Apr. 24, 2013, vol. 496, pp. 486-489.

Maertz et al., "Vector magnetic field microscopy using nitrogen vacancy centers in diamond,". Applied Physics Letters, published online: Mar. 1, 2010, vol. 96, pp. 092504-1 to 092504-3.

Pham et al., "Magnetic field imaging with nitrogen-vacancy ensembles" New Journal of Physics, Apr. 28, 2011, vol. 13, pp. 045021:1-13.

Popa et al., "Energy levels and decoherence properties of single electron and nuclear spins in a defect center in diamond". Physical Review B, Nov. 5, 2004, vol. 70, 201203.

Steinert et al., "High sensitivity magnetic imaging using an array of spins in diamond," Review of Scientic Instruments, published online: Apr. 23, 2010, vol. 81, Article 043705, 13 pages.

Taylor et al. "High-sensitivity diamond magnetometer with nanoscale resolution," Nature Physics, published online: Sep. 14, 2008, vol. 4, pp. 810-816.

Walsh, "A Closed Set of Normal Orthogonal Functions," American Journal of Mathematics, Jan. 1923, vol. 45, No. 1, pp. 5-24.

Wang et al. "An optogenetics- and imaging-assisted simultaneous multiple patch-clamp recording system for decoding complex neural circuits," Nature Protocols, Feb. 5, 2015, vol. 10, pp. 397-412.

* cited by examiner

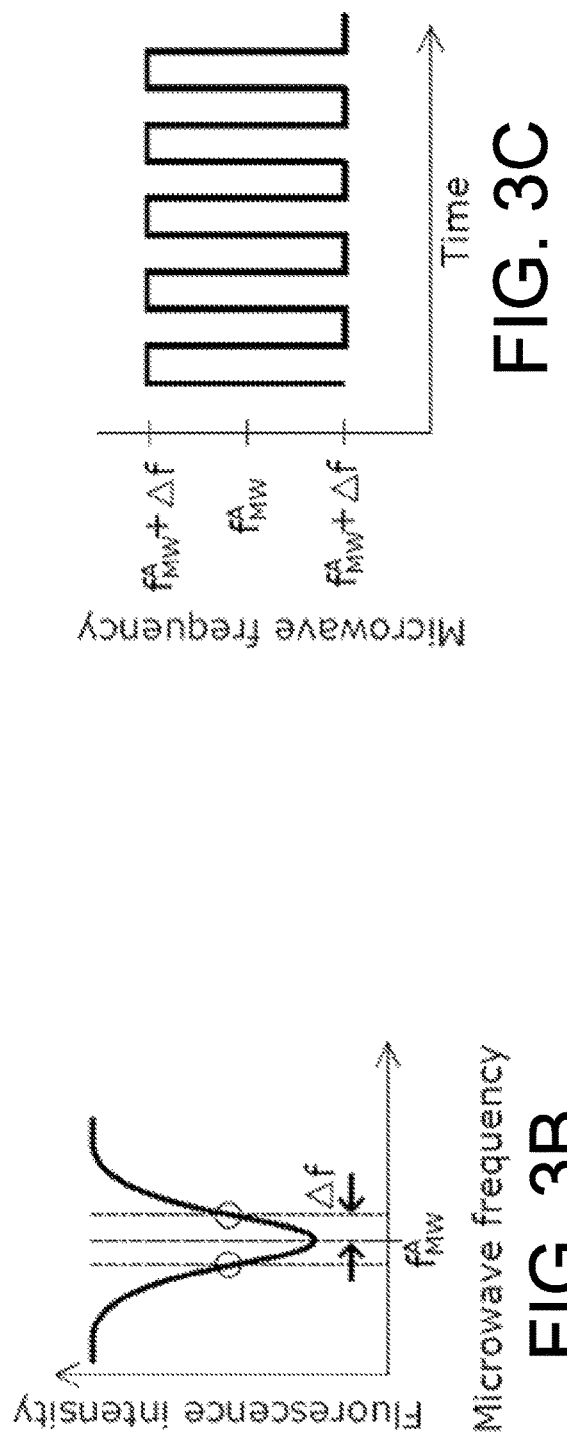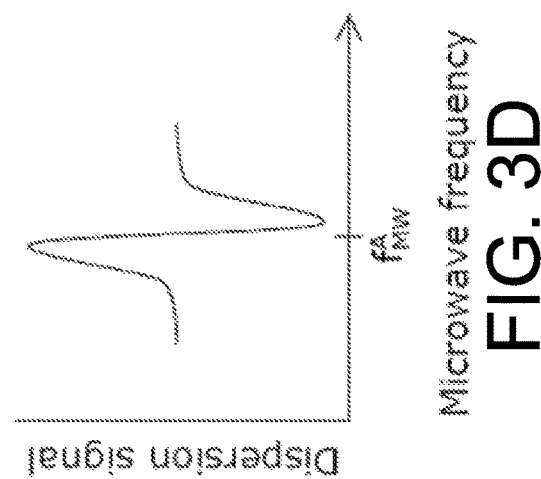
FIG. 3C
FIG. 3D
FIG. 3B

US 10,545,200 B2

SIMULTANEOUS VECTOR MAGNETOMETRY WITH NITROGEN VACANCY CENTERS IN DIAMOND OR OTHER SOLID-STATE SPIN SENSORS

CROSS-REFERENCE TO RELATED APPLICATIONS

This application is a national stage of PCT/US2017/035194, entitled "SIMULTANEOUS VECTOR MAGNETOMETRY WITH NITROGEN VACANCY CENTERS IN DIAMOND OR OTHER SOLID-STATE SPIN SENSORS," filed on May 31, 2017, which claims priority to U.S. Provisional Patent Application No. 62/346,193, filed Jun. 6, 2016 and titled "Simultaneous Vector Magnetometry with Nitrogen Vacancy Centers in Diamond," the entire contents of each of which are hereby incorporated by reference in their entirety.

STATEMENT REGARDING FEDERALLY SPONSORED RESEARCH OR DEVELOPMENT

The present invention was made with United States government support under Grant No. HR0011-11-C-0073, awarded by the Defense Advanced Research Projects Agency (DARPA), and under Grant No. W911NF-15-1-0548, awarded by the Army Research Office (ARO). The United States government has certain rights in this invention.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

INCORPORATION BY REFERENCE

All patents, patent applications and publications cited herein are hereby incorporated by reference in their entirety in order to more fully describe the state of the art as known to those skilled therein as of the date of the invention described herein.

FIELD OF INVENTION

The present invention relates to vector magnetometry and, more particularly, to the use of nitrogen vacancy (NV) centers in performing vector magnetometry.

BACKGROUND

Nitrogen vacancy (NV) centers are point defects in a diamond lattice that comprise a nearest-neighbor pair of a nitrogen atom, in substitution of a carbon atom, and a lattice vacancy. NV centers lie along each one of the four diamond crystallographic axes, and are generally distributed equally amongst these four spatial directions for ensembles of NV centers in diamond-based magnetic field sensors. To date, diamond-based vector magnetometry is performed by sequentially interrogating the NV centers along each direction (axis).

SUMMARY

The present disclosure describes methods of and systems for performing vector magnetometry using color center defects (e.g., nitrogen vacancy (NV) centers) in solid-state spin sensors such as diamond. In some embodiments, simultaneous vector (i.e., multi-axis) magnetometry is performed using a single diamond sensor while achieving the same or better sensitivity as with single-axis, single diamond magnetometry.

In some embodiments, a method of performing multi-axis vector magnetometry includes illuminating a solid-state spin sensor (e.g., comprising diamond) with a modulated or non-modulated optical signal, illuminating the solid-state spin sensor with a modulated microwave (MW) signal with multiple carrier frequencies, each of which addresses a resonance corresponding to a different color center defect crystallographic axis (e.g., NV axis) of a plurality of color center defect crystallographic axes of the solid-state spin sensor, such that multiple (e.g., four) color center defect crystallographic axes are addressed simultaneously; applying a first, bias magnetic field to the solid-state spin sensor; and detecting, via an optical detector at a fixed position relative to the solid-state spin sensor, light emitted from the solid-state spin sensor in response to the optical signal, the MW signal, and the first magnetic field. A modulation of the detected light can encode information that corresponds to magnetic field projections along each of the plurality of color center defect crystallographic axes (e.g., four NV axes) of the solid-state spin sensor. The method can also include demodulating the detected light and calculating a magnetic field projection along each of the color center defect crystallographic axes of the solid-state spin sensor based on the demodulated detected light, the calculated magnetic field projections corresponding to a second magnetic field.

In some embodiments, the modulated MW signal is a phase and frequency modulated MW signal, and/or is modulated by on-off keying.

In some embodiments, the detected light is amplitude modulated.

In some embodiments, the modulated MW signal is modulated to perform a Ramsey sequence or a Hahn echo sequence.

In some embodiments, a multi-axis vector magnetometer system includes one or more optical sources (e.g., a laser), one or more microwave generators, a magnetic field generator, a light collection element, an optical detector, an analog-to-digital converter and a computer. The optical source(s) can be configured to illuminate a solid-state spin sensor (e.g., comprising diamond) with a first, modulated or non-modulated light. The microwave generator can be configured to: (1) generate modulated microwaves encoding frequencies corresponding to multiple (e.g., each of up to four) color center defect crystallographic axes (e.g., NV axes of diamond); and (2) illuminate the solid-state spin sensor with the modulated microwaves. The magnetic field generator can be configured to apply a first magnetic field to the solid-state spin sensor. The light collection element can be optically coupled to an optical detector for detecting a second, emitted light from the solid-state spin sensor in response to the modulated light, the modulated microwaves and the first magnetic field. The analog-to-digital converter can be electrically coupled to the optical detector to convert the detected second light into a digital signal. The computer can be operably coupled to the analog-to-digital converter, the computer configured to: (1) demodulate the digital signal, and (2) calculate magnetic field projections along each of the color center defect crystallographic axes of the solid-state spin sensor based on the demodulated digital signal.

In some embodiments, the computer is operably coupled to the microwave generator to control the illumination of the solid-state spin sensor with the modulated microwaves and/or operably coupled to the optical source to control the illumination of the solid-state spin sensor with the first, modulated light.

In some embodiments, a multi-axis vector magnetometer system includes electronics configured to shift at least one of a phase and a frequency of the modulated microwaves, and/or includes electronics configured to apply on-off keying to the microwaves.

In some embodiments, the optical detector is a single-channel optical detector, a camera, or a photodiode (e.g., an avalanche photodiode).

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which:

FIG. 3B is a plot of fluorescence intensity versus microwave frequency showing a single NV resonance, in accordance with certain embodiments of the present invention;

FIG. 3C is a plot of microwave frequency for addressing the NV resonance of FIG. 3B, in accordance with certain embodiments of the present invention; and FIG. 3D is a plot of a dispersion signal resulting from demodulation of the fluorescence signal emitted by diamond in the presence of the applied microwaves of FIG. 3C, in accordance with certain embodiments of the present invention.

DETAILED DESCRIPTION OF THE INVENTION

Figure 1:
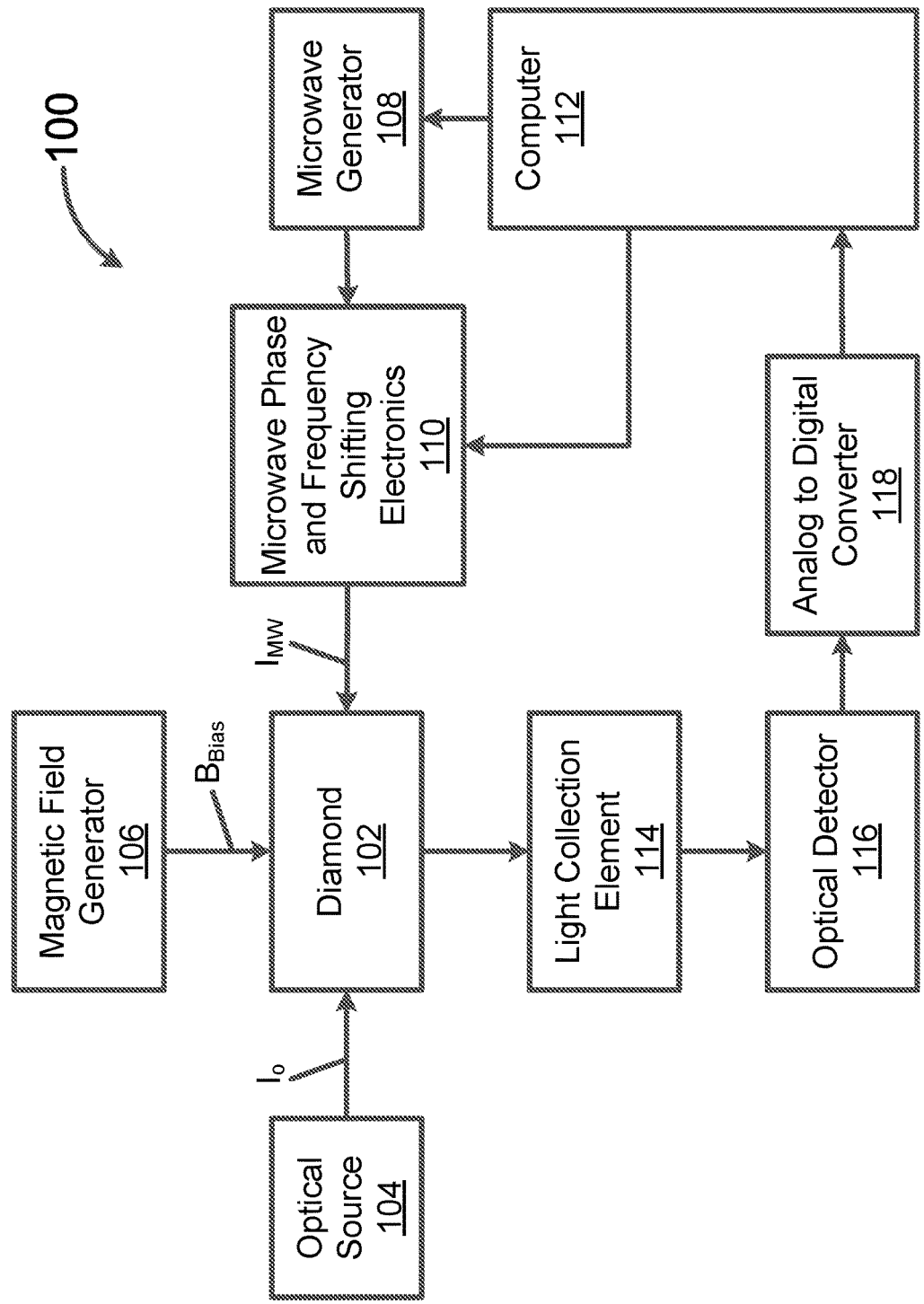
FIG. 1 is a block diagram of a diamond magnetometer system, in accordance with certain embodiments of the present invention.

The present disclosure describes methods of and systems for performing vector magnetometry using color center defects (e.g., nitrogen vacancy (NV) centers) in solid-state spin sensors such as diamond. In some exemplary embodiments set forth herein, improvements in vector magnetometry over existing techniques are achieved using nitrogen vacancy (NV) centers in diamond. For example, simultaneous vector (i.e., multi-axis) magnetometry is performed using a single diamond sensor while achieving the same or better sensitivity as with single-axis, single diamond magnetometry. Embodiments described herein are expected to reduce the time to perform diamond vector magnetometry measurements by a factor of four compared to using single-axis, single diamond magnetometry in which the magnetic fields along multiple spatial directions are measured sequentially in time. Although examples set forth herein are directed to NV centers in diamond, the present disclosure also contemplates use of the disclosed methods and systems for any other color center defect(s) within any other solid-state spin sensor.

When each individual NV axis is addressed in existing techniques, fluorescence from NVs oriented along the other three crystallographic axes (i.e., off-axis NVs) adds additional photonic shot noise and contains no signal content (i.e., no magnetometry information), degrading the measurement signal-to-noise ratio (SNR). To the inventors' knowledge, no scheme currently exists to completely eliminate fluorescence from all off-axis NVs in an ensemble. An NV ensemble refers to a collection of multiple (i.e., more than one) NV centers.

According to methods set forth herein, a measurement apparatus is configured to collect magnetometry "signal" from all four NV orientations simultaneously and continuously, thereby facilitating simultaneous vector magnetometry using a single diamond sensor, with no or less loss of magnetic field sensitivity as compared with pre-existing methods. In some embodiments of the present disclosure, vector magnetic field information for each of the diamond NV axes is measured simultaneously using periodically-modulated phase and frequency encoding of the NV electronic spin. Simultaneous information from the different NV axes can be communicated via periodic modulation of the NV spin-state-dependent fluorescence and collected using one or more optical detectors, such as a photodiode, avalanche photodiode, photomultiplier tube, or a camera. In some embodiments, the method is performed using a laser and hardware (e.g., generators and switches) for generating and/or modulating four microwave (MW) frequencies in order to concurrently address all four of the NV orientations.

It is expected that NV diamond based magnetometers will replace fluxgate magnetometers for bulk magnetic field sensing in military, industrial and commercial applications in the near future, making techniques for more efficient diamond vector magnetometry, such as those described herein, of great practical relevance.

Methods described herein are applicable to NV diamond magnetometers operating using continuous wave electron spin resonance (CW-ESR) with a single channel optical detector, pulsed measurements (e.g., Ramsey sequences, Hahn echo sequences, etc.) with a single channel optical detector, CW-ESR imaging experiments with a camera, or pulsed measurements (e.g., Ramsey sequences, Hahn echo sequences, etc.) with a camera. Methods described herein are compatible with a variety of pulse sequences, and are not limited to the pulse sequences listed herein.

Simultaneous Vector Magnetometry

When designing and/or performing NV diamond magnetometry measurements, it can be advantageous to move the measurement bandwidth away from DC to reduce "1/j" noise (i.e., noise that is inversely proportional to the modulation frequency). By moving the center of the measurement bandwidth to a specific frequency, multiple measurements, encoded in different parts of the frequency spectrum, can be made simultaneously. In some embodiments, although multiple NV axis measurements are performed simultaneously, only a single detector of the NV spin-state-dependent fluorescence can be used, and the multiple measurements can be separated from each other via real-time processing of the single channel optical signal using hardware and/or software. In other embodiments, multiple detectors of the NV spin-state-dependent fluorescence can be used.

In some simultaneous vector magnetometry methods described herein, the NV-diamond sensor's magnetic field detection bandwidth can be reduced by up to a factor of four from the maximum possible sensor bandwidth for existing, single-axis diamond magnetometers.

FIG. 1 is a block diagram of a diamond magnetometer system, in accordance with certain embodiments of the present invention. The magnetometer system 100 includes a diamond 102 having nitrogen vacancies (NVs) along each of its four crystallographic axes. As shown, an optical source 104 (e.g., a laser) applies optical illumination ($I_O$) to the diamond 102. One or more (e.g., four) microwave generators 108 generate microwaves, which are transmitted to and modulated by microwave phase and frequency shifting electronics and one or more (e.g., four) microwave switches 110. For example, the microwave switches 110 can turn the microwaves on and off. The modulated microwaves ($I_{MW}$) are directed at the diamond 102. Application and/or modulation of the optical illumination and/or the microwave illumination can be controlled by a computer 112. The $I_O$ and $I_{MW}$ illuminate the NVs along all four axes of the diamond 102 either simultaneously or sequentially/alternately in time. A bias magnetic field ($B_{Bias}$), supplied by magnetic field generator 106, is also applied to the diamond 102, so that the resonances corresponding to each of the four NV axes can be addressed. Fluorescence from the diamond, resulting from the applied $I_O$, $I_{MW}$, $B_{Bias}$ and the magnetic field being measured, is collected by light collection element (such as a lens, objective, light pipe, aspheric condenser, parabolic concentrator, or other imaging or light collecting optic) 114 and sent to an optical detector 116, whose output is digitized by an analog to digital converter 118 and sent to computer 112. Based on the known pattern of microwave radiation applied to address each NV axis, the computer demodulates the digitized light signal to separate out the changes in light signal due to the magnetic field projection along each of the four NV axes. Using the magnetic field projection along the four NV axes, the computer then calculates the magnetic field components (in x, y, and z directions) relative to the diamond magnetometer. Switches and other components to set the optical illumination and the microwaves on/off are not shown.

Figure 2:
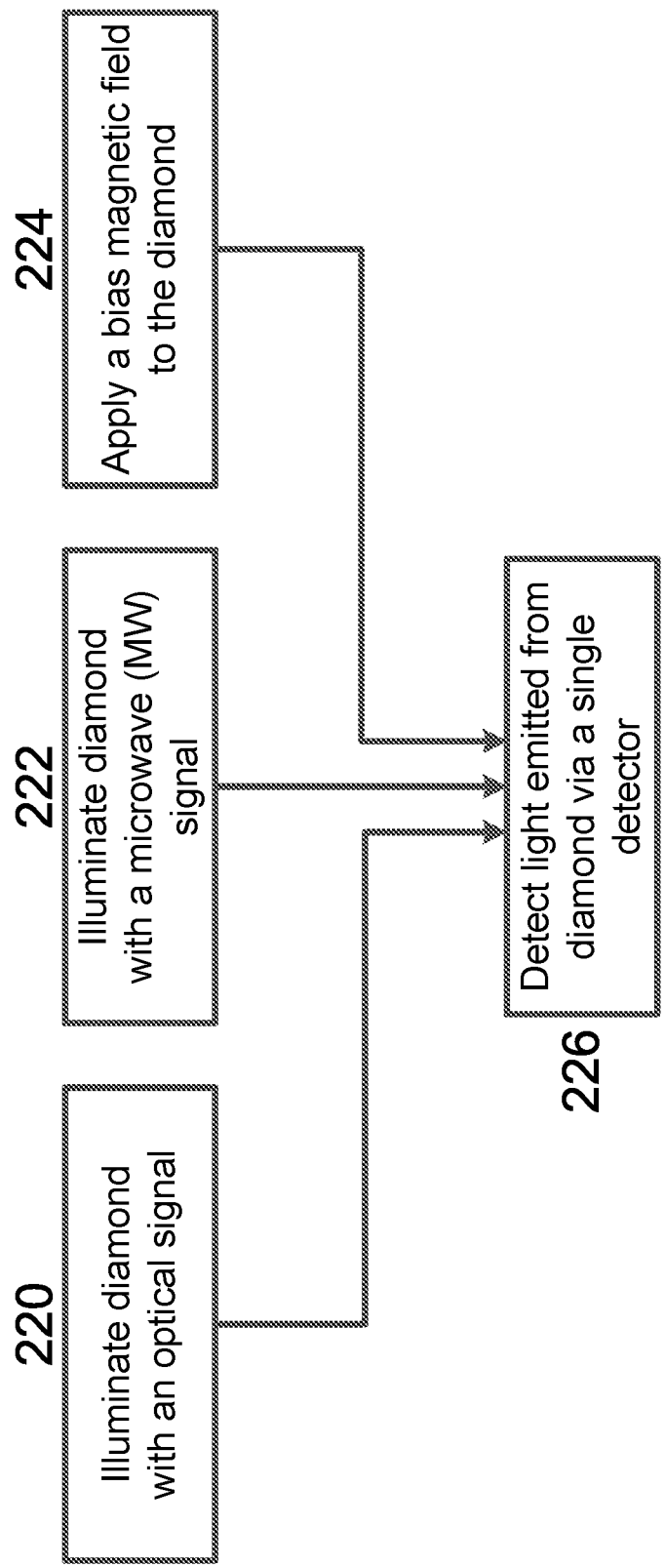
FIG. 2 shows a method of performing vector magnetometry, in accordance with certain embodiments of the present invention.

FIG. 2 shows a method of performing vector magnetometry, in accordance with certain embodiments of the present invention. As shown, the method includes illuminating a diamond with a modulated or non-modulated optical signal (220), illuminating the diamond with a modulated microwave (MW) signal (222) and applying a first, bias magnetic field to the diamond (224). In implementations illuminating the diamond with a modulated optical signal, the illumination is turned on and off using a device such as an acousto-optic modulator or via direct modulation of a green laser diode's current. The optical illumination in such implementations is used either to initialize the quantum states of the NV centers or to read out the quantum states of the NV centers. Such implementations employ MW signals which have fixed frequency at or near the NV resonances, but the MWs are also turned on and off in time. In implementations with non-modulated (continuous) optical illumination of the diamond, the MWs are applied continuously as well, but the individual microwave signals (each of which addresses a different NV resonance) are frequency modulated in time with the carrier frequency being at or near the NV resonance. In some embodiments, each of 220, 222 and 224 are performed in parallel. Light emitted from the diamond in response to the optical signal (220), the MW signal (222), and the first magnetic field (224) is detected via one or more optical detectors at a fixed position relative to the diamond (226). Amplitude modulation of the detected light can encode information that corresponds to the magnetic field projection along a plurality of nitrogen vacancy (NV) axes of the diamond. The magnitude of the amplitude modulation is linearly proportional to the magnetic field along that NV axis, and occurs at the modulation frequency of the MWs that address the resonance of that NV axis.

For implementations where both the optical illumination signal and the MW signal are applied continuously, the magnetic field projection along each NV axis can be encoded in the amplitude modulation of the resulting fluorescence signal. By frequency modulating the MW signal applied to each different NV axis at a different modulation frequency, the amplitude modulation encoding the magnetic signal along each different NV axis is shifted to a different frequency band in the resulting optical fluorescence signal. After the fluorescence signal is recorded, demodulation of the fluorescence can recover the signal corresponding to the magnetic field projection along each NV axis. This method is analogous to frequency division multiple access (FDMA) methods where the frequency channel for each NV axis is centered around the modulation frequency corresponding to that NV axis.

For implementations where both the optical illumination signal and the MW signal are on/off modulated, the phases of the applied MWs addressing each NV resonance can be controlled so that the amplitude modulation of the resulting fluorescence signal (which contains information of the magnetic field projection along each of the NV axes) is encoded at multiple frequencies simultaneously using orthogonal binary sequences. In this way, the encoding of the magnetic signal in the resulting optical fluorescence signal is analogous to code division multiple access (CDMA) where information encoding the magnetic field projection along each NV axis is sent simultaneously over the same channel.

CW-ESR and a Single Channel Detector Implementation of Simultaneous Vector Magnetometry Current state-of-the-art continuous wave electron spin resonance (CW-ESR) techniques for NV diamond based magnetometry are outlined in the methods of Barry et al. ("Optical magnetic detection of single-neuron action potentials using quantum defects in diamond, Proceedings of the National Academy of Sciences 113, 14133-14138 (2016). In Barry, the microwave frequency $f_{MW}$ is square-wave-modulated at frequency $f_{mod}$ with frequency deviation $f_{dev}$ to shift the measurement bandwidth away from DC. Lock-in detection is used to demodulate the resulting signal. The technique described in Barry can be used to sense magnetic fields only along a single direction (i.e., along a single vector which is a linear combination of the vectors lying along the four crystallographic axes of the diamond) at a time.

In some embodiments of the present disclosure, CW-ESR can be employed simultaneously for all four NV axes in diamond, with no reduction, or near-negligible reduction, in magnetic field sensitivity as compared with previous CW-ESR approaches. For example, a bias magnetic field Bo can be applied to the diamond sample to separate (in frequency) the optically detected magnetic resonance (ODMR) features of all four NV axes so that unintended cross-excitation between MWs and other NVs is negligible. Separate MW frequencies $f_{MW}^A$, $f_{MW}^B$, $f_{MW}^C$, $f_{MW}^D$ can be applied to address all four NV orientations. All four MW frequencies can be modulated (e.g., using square-wave modulation, sinusoidal modulation, or another modulation waveform) at different corresponding modulation frequencies $f_{mod}^A$, $f_{mod}^B$, $f_{mod}^C$, $f_{mod}^D$. In some implementations, more than four microwave frequencies (e.g., 8, 16, or 24) can be used to address the multiple resonances of each NV orientation, however four frequencies is the minimum expected to address each NV orientation individually. The resulting fluorescence signal emitted simultaneously from the diamond NVs in response to the applied, multi-frequency MW signal can be detected using one or more optical detectors, and digitized. Demodulation of the detected, digitized signal can then be performed using software and/or hardware (e.g., using four separate hardware lock-in amplifiers or a multi-channel lock-in amplifier). Both square-wave modulation and sinusoidal modulation are expected to work. However, with square wave modulation, the user should ensure that the harmonics of the four modulation frequencies do not inadvertently overlap.

Lock-in amplifier techniques can be applied to CW-ESR by encoding the signal corresponding to the magnetic field projection along each NV axis at a different frequency and using lock-in techniques to extract the magnetic field projection along each NV axis. In the same way that a lock-in amplifier rejects out-of-band noise, the lock-in amplifier associated with each NV axis can reject signals associated with the magnetic field projection along other NV axes. In the following sections, further applications of this technique, including pulsed measurements (e.g., Ramsey sequences, Hahn echo sequences, Car-Purcell-Meiboom-Gill sequences, or any other pulse sequence) and camera-based measurements, are described, in accordance with some embodiments.

NV Resonances and Locking Method for CW-ESR

Figure 3A:
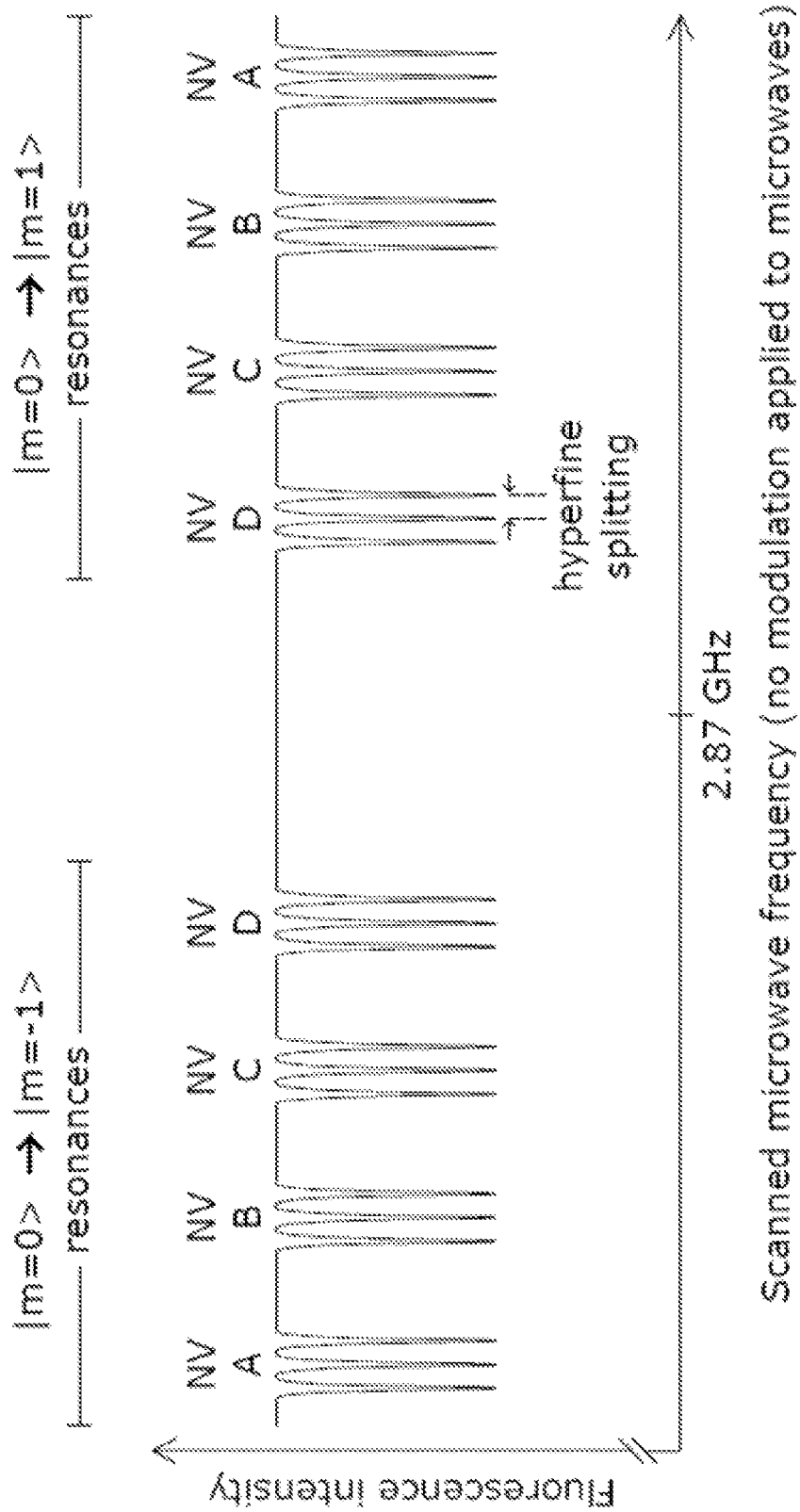
FIG. 3A is a plot of fluorescence intensity versus scanned microwave frequency during continuous optical illumination of diamond, showing nitrogen vacancy (NV) resonances, in accordance with certain embodiments of the present invention.

The fluorescence intensity during continuous optical illumination of the diamond varies as a function of the microwave radiation applied to the diamond, for example as shown in FIG. 3A. When the microwave frequency is appropriate to drive a transition between m=0 to m=+/−1 quantum states, the NVs along the axis addressed by the MW frequency are pumped into the m=+/−1 states respectively, and a decrease in fluorescence is observed. The position of the resonances for each of the NV A, NV B, BV C and NV D axes is a function of the projected magnetic field along that NV's axis. Here a first bias magnetic field has been applied so that the resonances from the different NV axes are easily resolved. Each NV axis has a pair of MW resonances which correspond to driving a magnetic transition from the m=0 state into either the m=−1 state (where the resonances reside below 2.87 GHz) or into the m=1 state (where the resonances reside above 2.87 GHz). Further splittings, induced by the hyperfine interaction between the Nitrogen nuclear spin and the NV electronic spin, depend on the isotope of nitrogen used to make the NVs in the diamond. For example, $^{15}N$ will result in a hyperfine doublet splitting and $^{14}N$ will result in a hyperfine triplet splitting. The diagram of FIG. 3A is for $^{14}N$ and thus consists of 4×2×3=24 resonances, where the 4 corresponds to the number of NV axes, the 2 corresponds to the doubling of resonances due to the m=+1 and m=−1 states, and the 3 corresponds to the triplet hyperfine structure from $^{14}N$.

A single resonance in an ensemble NV magnetometer has an approximately Lorentzian line shape, as shown, by way of example, in FIG. 3B. MWs address this resonance with carrier frequency $f_{MW}^A$ and are frequency modulated with frequency deviation $\Delta f$ at modulation frequency $f_{mod}^A$. The modulation waveform is a square wave, and results in the microwave frequency profile as a function of time shown in FIG. 3C. The value of $\Delta f$ is chosen so that the MW radiation continuously interrogates the two points of steepest slope of the Lorentzian line shape (annotated as the two circled regions in FIG. 3B). Appropriate demodulation of the fluorescence signal (in the presence of the above described frequency modulation of the applied MWs) results in a dispersion signal as shown in FIG. 3D. To operate as a magnetometer, the value of $f_{MW}^A$ is either fixed or dynamically varied to track the resonance. Application/change of a second magnetic field ($\Delta B$) will shift the location of the resonance and the recorded value of the fluorescence after demodulation will depend linearly on the $\Delta B$. In this discussion and for most of this patent we have neglected addressing multiple hyperfine resonances simultaneously (as demonstrated in Barry 2016) or driving both the $|m=0\rangle \Longrightarrow |m=-1\rangle$ and $|m=0\rangle \Longrightarrow |m=1\rangle$ transitions of a single NV axis simultaneously; both have been previously demonstrated in the literature, and can be implemented easily in addition to the main invention discussed in this patent.

Figure 4:
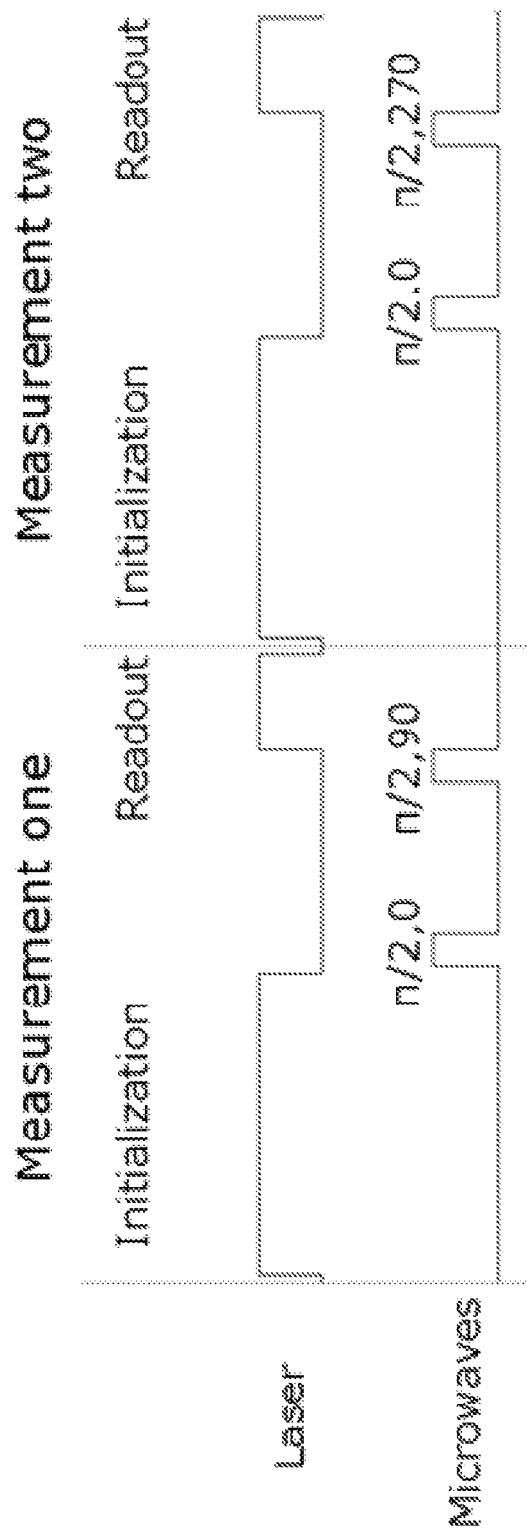
FIG. 4 is a plot showing laser and microwave sequences for cancelling laser noise intensity for pulsed measurements.

Pulsed Measurements and a Single Channel Detector Implementation of Simultaneous Vector Magnetometry In some embodiments, the above implementation can be extended to pulsed measurements (e.g., Ramsey sequences, Hahn echo sequences, Car-Purcell-Meiboom-Gill sequences, etc.). For example, in a typical Ramsey-type sine magnetometry measurement with NVs, two consecutive Ramsey sequences are performed and, for every second sequence, the phase of the final π/2 pulse is alternated by 180 degrees. The time-averaged magnetic signal during discrete measurement time periods 0 and 1, denoted $\langle B[0,1] \rangle$, is then given (for the chosen NV axis) by $$\langle B[0,1] \rangle = \alpha \left[ \frac{S[0] - S[1]}{S[0] + S[1]} \right] \quad (1)$$

where S[n] is the laser-induced-NV-fluorescence collected in the $n^{th}$ discrete measurement and α is a proportionality constant based on both fundamental and physical parameters of the NV magnetometer system (e.g., the NV gyromagnetic ratio, the numbers of NVs interrogated, etc.). This scheme can also be used to normalize out laser intensity fluctuations and subtract background fluorescence. We now describe this scheme in more detail: For example, FIG. 4 is a plot showing laser and microwave sequences for canceling laser noise intensity for pulsed measurements, according to some embodiments. This existing technique for making sensitive magnetometry measurements while canceling laser noise works as follows: The polarization of a diamond NV is first initialized into the m=0 quantum state by continuous irradiation of optical light (see "Initialization" portion for measurement one in FIG. 4). Thereafter, a π/2 microwave pulse with phase=0° (denoted in FIG. 4 as "π/2,0") is applied. The NV spins then precess in the presence of the applied magnetic field. Thereafter, a π/2 pulse with phase=90° is applied (π/2,90), followed by optical illumination to read out the NV state (see "Readout" label for measurement one in FIG. 4). Higher fluorescence (e.g., exceeding a predetermined value) corresponds to the NV being probabilistically in the m=0 state, while lower fluorescence (e.g., lower than a predetermined value) corresponds to the NV being probabilistically in the m=+/−1 quantum states.

In some pulsed measurement embodiments, such as the embodiment shown in FIG. 4, the MW and optical illumination are alternated (i.e., they are not, at any point, applied at the same time). It is noted here that for just a single measurement, if the laser intensity fluctuates, these fluctuations will also result in differing amounts of fluorescence collected. With just a single measurement, it is not possible to differentiate a variation in laser intensity from a variation in the magnetic field being measured, as the amount of collected fluorescence depends on both. Therefore, for the next measurement (measurement two in FIG. 4), the initialization and the first microwave π/2 pulse are identical to the first measurement. However, unlike in measurement one, the π/2 pulse immediately prior to readout in measurement two is instead applied with a phase of 270°. The magnetic field can then be calculated from both measurements using Equation 1.

This process can then be repeated, and yields a magnetic field value after every two readout laser pulses. Using this method, the dependence of the magnetometer to laser intensity noise is vastly reduced, and the magnetometer is nearly insensitive to slow drift in the laser intensity. With this method, the magnetometer may now be substantially only susceptible to laser intensity noise centered at frequency $f=1/(2*T_{period})$ where $T_{period}$ is the time between readouts (i.e., the time for a measurement with a single readout). In the example set forth above, we have chosen for discussion the shortest length coding sequence to cancel laser intensity noise. Since the above sequence adds S[1] and subtracts S[2], this coding sequence can be thought of as consisting of a plus followed by a minus. Longer sequences can also be used to cancel laser intensity noise. For example, a coding sequence of plus/plus/minus/minus (i.e., four readouts yielding photon numbers of S[1], S[2], S[3], S[4]) can be used, and the magnetic field (along the NV axis of choice) is then proportional to $$B\alpha(S[1]+S[2]-S[3]-S[4])/(S[1]+S[2]+S[3]+S[4]) \quad (2)$$

It is again noted that the phase of the last π/2 pulse is set to be 90° for a "plus" measurement, and the phase is set to 270° for a "minus" measurement. There are many coding sequences that can be used to cancel laser intensity noise. For efficient laser noise cancellation, the number of pluses can be equal to the number of minuses for the coding sequence. Using careful coding sequence selection, magnetometry can be performed simultaneously along all four NV axes in a way where the magnetic signal along the four different NV axes can be encoded on a single optical channel and later separated out using computer-based demodulation methods.

Another extension of this technique, in accordance with some embodiments, sums multiple measurements. For example, the following calculation can be employed (for the magnetic field along the NV A axis):

$$\langle B^A[0:7]\rangle = \alpha\left[\frac{S[0]-S[1]+S[2]-S[3]+S[4]-S[5]+S[6]-S[7]}{S[0]+S[1]+S[2]+S[3]+S[4]+S[5]+S[6]+S[7]}\right] \quad (3)$$

which effectively reduces the magnetic field sensing bandwidth by a factor of four over that given by Eqn. 1. At the same time, resonant MWs can be applied to the NVs oriented along the B, C and D axes respectively. The bias magnetic field Bo is assumed to be large enough (e.g., of order 100 G) such that off-resonant cross-coupling between MWs and other NV classes can be ignored. The phase of the MWs applied to the NV B, NV C, NV D orientations can be controlled such that the magnetic signal along the NV B, NV C, and NV D axes is given respectively by $$\langle B^B[0:7]\rangle = \alpha\left[\frac{S[0]-S[1]-S[2]+S[3]+S[4]-S[5]-S[6]+S[7]}{S[0]+S[1]+S[2]+S[3]+S[4]+S[5]+S[6]+S[7]}\right] \quad (4)$$

$$\langle B^C[0:7]\rangle = \alpha\left[\frac{S[0]+S[1]-S[2]-S[3]+S[4]+S[5]-S[6]-S[7]}{S[0]+S[1]+S[2]+S[3]+S[4]+S[5]+S[6]+S[7]}\right] \quad (5)$$

$$\langle B^D[0:7]\rangle = \alpha\left[\frac{S[0]+S[1]+S[2]+S[3]-S[4]-S[5]-S[6]-S[7]}{S[0]+S[1]+S[2]+S[3]+S[4]+S[5]+S[6]+S[7]}\right] \quad (6)$$

Figure 5:
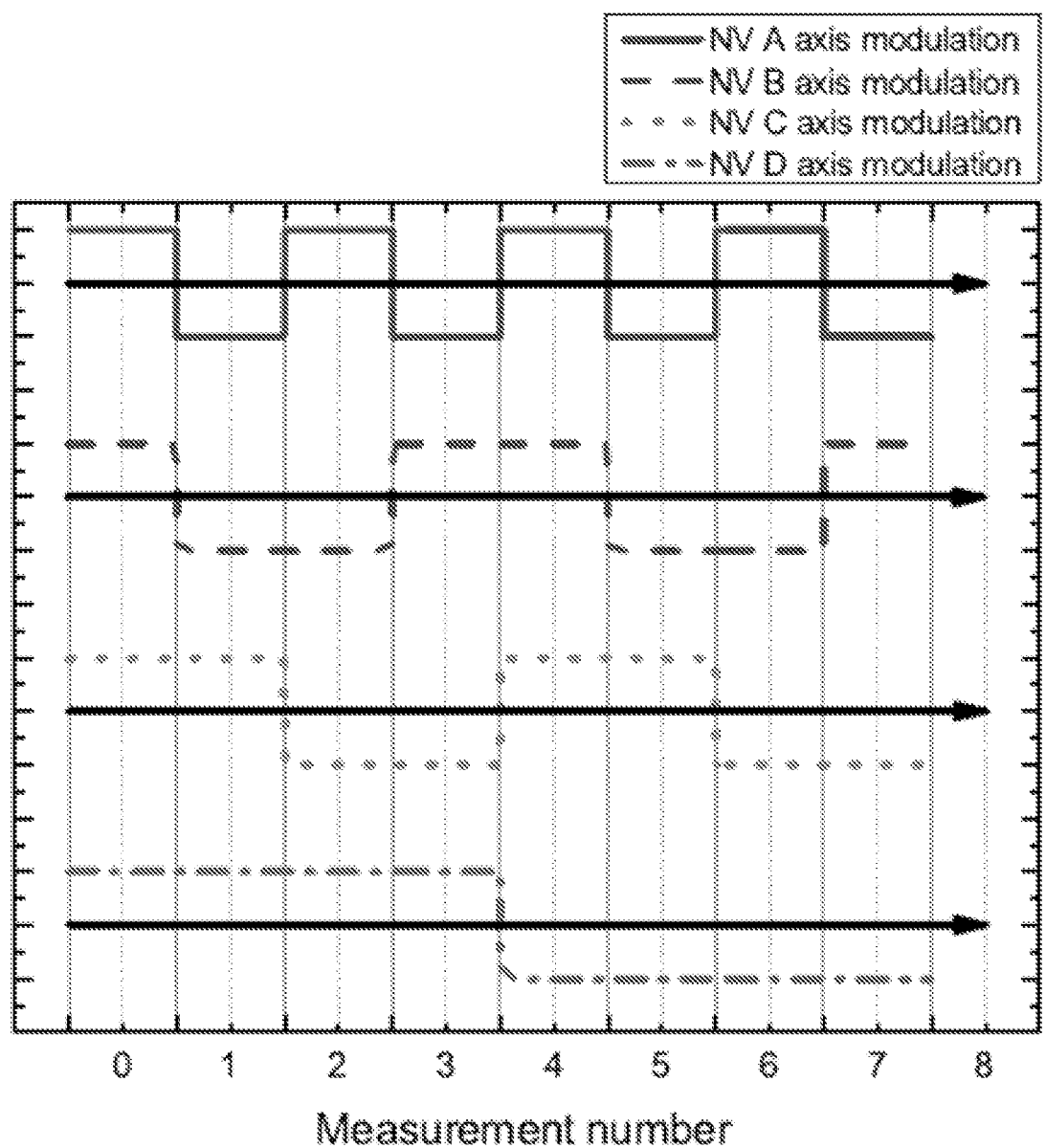
FIG. 5 is a plot of orthogonal binary sequences in accordance with certain embodiments of the present invention.

In some embodiments, for effective demodulation, the encoding sequences employed (the patterns of + and −) are orthogonal. The benefits of orthogonality in encoding are discussed, for example, in communications theory. For example, Walsh codes are widely used in commercial communication systems to send multiple signals over the same channel. In embodiments of the present disclosure, effective laser intensity noise cancellation can be achieved when the mean value of the encoding signal is zero. For some NV magnetometers, laser intensity noise cancellation is the primary reason that phase control of the MWs is implemented. The minimum length sequences satisfying the above requirements are shown in FIG. 5. Minimum length sequences are desired to minimize the reduction in the maximum magnetic field frequency the device is capable of sensing.

For systems and methods presented herein, an expected challenge is avoiding cross-excitation, where microwave frequencies off-resonantly address NV orientations they aren't intended to address. This issue can likely be solved with a sufficiently strong Bo field (e.g., on the order of about 100 Gauss), however for practical reasons such as field homogeneity and temporal stability, smaller values of Bo may be more desirable.

Camera Implementation of Simultaneous Vector Magnetometry

Systems and methods described herein can also be implemented for camera-based NV-diamond magnetic field sensing and imaging. For example, for a camera-based NV diamond magnetometry setup using CW ESR, the consecutive images for each exposure can correspond to S[0], S[1], S[2], etc., and the sign of the addition/subtraction can correspond to which side of the Lorenzian absorption feature is addressed by the applied MW radiation. The magnetic field along each NV axis can be then calculated using Equations 2-5. For a camera-based setup using pulsed measurements (Ramsey sequences, Hahn echo sequences, etc.), the same equations can be used, but the microwave phase is manipulated, in some embodiments, in the same way as described above for pulsed magnetometry with a single channel optical detector.

Upon review of the description and embodiments of the present invention, those skilled in the art will understand that modifications and equivalent substitutions may be performed in carrying out the invention without departing from the essence of the invention. Thus, the invention is not meant to be limiting by the embodiments described explicitly above, and is limited only by the claims which follow.

What is claimed is:

1. A method of performing multi-axis vector magnetometry, the method comprising:
    illuminating a solid-state spin sensor with a modulated or non-modulated optical signal;
    illuminating the solid-state spin sensor with a modulated microwave (MW) signal with multiple carrier frequencies, each of which addresses a resonance corresponding to a different color center defect crystallographic axis of a plurality of color center defect crystallographic axes of the solid-state spin sensor such that multiple color center defect crystallographic axes are addressed simultaneously;

applying a first magnetic field to the solid-state spin sensor; and detecting, via an optical detector at a fixed position relative to the solid-state spin sensor, light emitted from the solid-state spin sensor in response to the optical signal, the MW signal, and the first magnetic field, wherein a modulation of the detected light encodes information corresponding to magnetic field projections along each of the plurality of color center defect crystallographic axes of the solid-state spin sensor.

2. The method of claim 1, further comprising:
demodulating the detected light; and
calculating the magnetic field projection along each of the color center defect crystallographic axes of the solid-state spin sensor based on the demodulated detected light, the calculated magnetic field projections corresponding to a second magnetic field.

3. The method of claim 1, wherein the modulated MW signal is a phase and frequency modulated MW signal.

4. The method of claim 1, wherein the modulated MW signal is modulated by on-off keying.

5. The method of claim 1, wherein the plurality of color center defect crystallographic axes of the solid-state spin sensor comprises four color center defect crystallographic axes.

6. The method of claim 1, wherein the detected light is amplitude modulated.

7. The method of claim 1, wherein the modulated MW signal is modulated to perform a Ramsey sequence.

8. The method of claim 1, wherein the modulated MW signal is modulated to perform a Hahn echo sequence.

9. A multi-axis vector magnetometer system, comprising:
an optical source configured to illuminate a solid-state spin sensor with a modulated or non-modulated light;
a microwave generator configured to: (1) generate modulated microwaves encoding frequencies corresponding to multiple color center defect crystallographic axes of the solid-state spin sensor; and (2) illuminate the solid-state spin sensor with the modulated microwaves;
a magnetic field generator configured to apply a first magnetic field to the solid-state spin sensor;
a light collection element optically coupled to an optical detector for detecting an emitted light from the solid-state spin sensor in response to the modulated light, the modulated microwaves and the first magnetic field;
an analog-to-digital converter electrically coupled to the optical detector to convert the detected second light into a digital signal; and
a computer operably coupled to the analog-to-digital converter, the computer configured to: (1) demodulate the digital signal, and (2) calculate magnetic field projections along each of the color center defect crystallographic axes of the solid-state spin sensor based on the demodulated digital signal.

10. The system of claim 9, wherein the computer is further operably coupled to the microwave generator to control the illumination of the solid-state spin sensor with the modulated microwaves.

11. The system of claim 9, wherein the computer is further operably coupled to the optical source to control the illumination of the solid-state spin sensor with the modulated light.

12. The system of claim 9, further comprising electronics configured to shift at least one of a phase and a frequency of the modulated microwaves.

13. The system of claim 9, further comprising electronics configured to apply on-off keying to the microwaves.

14. The system of claim 9, wherein the optical source comprises a laser.

15. The system of claim 9, wherein the optical detector is a single-channel optical detector.

16. The system of claim 9, wherein the optical detector is a camera.

17. The system of claim 9, wherein the optical detector is a photodiode.

18. The system of claim 17, wherein the photodiode is an avalanche photodiode.

* * * * *